PIEZOELECTRIC SEMICONDUCTOR OSCILLATOR

Filed May 1, 1964

INVENTOR
James S. Crabbe

BY Thomas A. Harwood

ATTORNEY

INVENTOR
James S. Crabbe

BY Thomas A. Harwood

ATTORNEY

United States Patent Office 3,325,748
Patented June 13, 1967

3,325,748
PIEZOELECTRIC SEMICONDUCTOR OSCILLATOR
James S. Crabbe, Richardson, Tex., assignor to Texas Instruments Incorporated, Dallas, Tex., a corporation of Delaware
Filed May 1, 1964, Ser. No. 364,233
2 Claims. (Cl. 331—107)

This invention relates generally to the generation of electrical oscillations, and more particularly to a generator utilizing a piezoelectric semiconductor device as the active component for generating high frequency electrical oscillations. The primary utility of the invention is in its application to miniature circuits such as solid-state semiconductor networks, for example, wherein a high frequency source in the radio and microwave frequency range is required. However, it can be used in any application that conventional high frequency generators are used as an equivalent thereof.

The significance of integrated miniature circuits has caused the stimulation of investigations in the area of solid-state technology to provide devices and functions which are the equivalent, or nearly so, of many of the more classical circuit components. The present invention is a direct result of one such investigation in this vast area, wherein there is provided a generator of high frequency oscillations utilizing a solid-state device that can be integrated into a solid-state miniature circuit. The utility is obvious in this particular application the same as other oscillators, such as the Klystron generator, for example, had in their application to the more classical circuits. The simplicity of the oscillator of this invention, resulting from the primary solid-state nature thereof, lends advantages heretofore unattainable.

Briefly, the invention uses a solid crystal of material which generates high frequency electrical oscillations in response to a current flow therethrough, and to effect this, the crystal must be piezoelectric in nature. Moreover, the electrical conductivity of the crystal must be higher than that of the usual insulators which exhibit a piezoelectric effect and is preferably controllable, all of which requires the crystal to be a semiconductor. It is believed that the generation of the high frequency oscillations is the result of the interaction between drifting electrons within the crystal caused by applying a voltage thereacross and an ultrasonic wave traveling therethrough which is produced by the applied voltage. However, to sustain the oscillations and derive them from the crystal as a useful output signal, the crystal must be properly loaded electrically, since the crystal has been observed to exhibit an effective negative resistance effect. Thus, the invention comprises a solid-state crystal which acts as the active device for generating oscillations, an electrical source for stimulating the crystal and an impedance connected to the crystal to provide the proper load to sustain the oscillations as a useful output signal. It is apparent that the high frequency generator of the invention is very simple in structure and can be readily adapted to solid-state miniature circuits, although it is certainly not limited to this application. Other objects, features and advantages will become apparent from the following detailed description of the invention when taken in conjunction with the appended claims and the attached drawing wherein like reference numerals refer to like parts throughout the several figures and in which:

Two effects of importance have previously been observed in piezoelectric semiconductor crystals which are believed, at least in some cases, to be intimately related to the high frequency oscillations effect produced by this invention. These are the amplification of an ultrasonic wave traveling through such a crystal, and a current limiting effect within the crystal when an electric field of predetermined minimum value is created within the crystal. Because of the technical complexity of the invention insofar as the physical phenomena producing all these effects within the crystal and the apparent close relationship of the three effects, it is believed that the following preliminary discussion relating to the amplification and current limiting effects will prove helpful in understanding the invention.

Ultrasonic waves traveling in a piezoelectric semiconductor material can be amplified by coupling energy from drifting electrons within the crystal caused by an electrical bias into the ultrasonic wave, and is so described by D. L. White in J. Appl. Phys., volume 33, page 2547 (1962). An ultrasonic wave, which is a high frequency sound wave, traveling through a piezoelectric material also creates an electric field. This is well known to occur in a piezoelectric crystal, wherein a mechanical displacement of a piezoelectric crystal creates an electric field; and, conversely, an electric field stimulating a piezoelectric crystal will cause a mechanical displacement or a sound wave therein. Two distinct piezoelectric effects are observed, which are the extensional wave phenomenon and the shear wave phenomenon, all of which are well known. As discussed in the above noted White reference, if the material or crystal is also a semiconductor, the electric field created by the ultrasonic sound wave traveling therethrough also causes current to flow because of the relatively high electrical conductivity of the semiconductor, and thus creates periodic space charges which accordingly modulate the conductivity of the semiconductor. By creating an electric field in the sample by applying an external voltage thereacross, an additional current flow is created within the crystal which, when combined with the electric field caused by the traveling ultrasonic wave, produces an alternating electric field which is dependent on the changing conductivity of the material. Under proper conditions, this alternating field transfers energy to the ultrasonic wave and causes the latter to be amplified.

Figure 1:
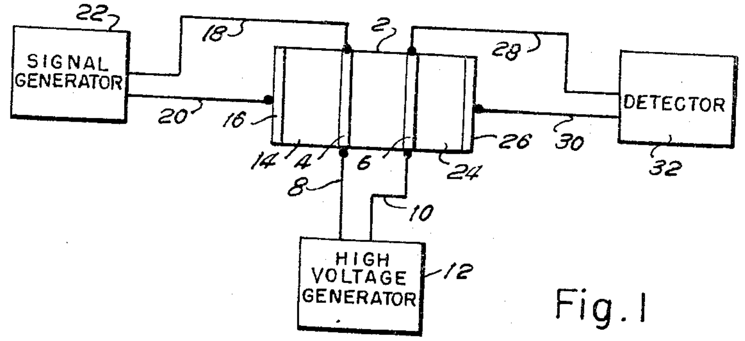
FIGURE 1 is a block diagram of a piezoelectric semiconductor crystal, within which the effect of the invention may be produced, and related apparatus connected thereto for generating both an electrical pulse and an acoustical pulse within the crystal.

Referring now to FIGURE 1, there is shown a block diagram of a piezoelectric semiconductor crystal and related apparatus for producing the ultrasonic amplification effect within the crystal. A piezoelectric semiconductor crystal 2 has an electric field established therein by the application of a voltage across opposite faces thereof through contacts 4 and 6 and electrodes 8 and 10 attached to the contacts 6 and 4, respectively. The electrodes are connected to a high voltage generator 12 for generating the electric field in the sample. A suitable electromechanical transducer 14, which is another piezoelectric crystal such as quartz, is attached to one face of the crystal against contact 4 and is driven by an electrical signal applied across contact 4 and another contact 16 opposite thereto to generate a sound wave within the crystal. The transducer 14 is driven by an electrical signal generator 22 connected to contacts 4 and 16 by means of electrodes 18 and 20, respectively. Because of the piezoelectric nature of the transducer, a mechanical vibration is generated thereby and coupled into the crystal 2 in response to the electrical stimulus from the generator 22. The exact frequency of the sound wave generated by the transducer is governed by the frequency of the input electrical signal. An output transducer 24, which is also a piezoelectric crystal, is similarly mechanically coupled to the other face of crystal 2 to produce an electrical signal in response to the sound wave traveling through the crystal. An electrical contact 26 is provided to the face of the output transducer opposite crystal 2, and a suitable detector, such as an oscilloscope, for example, is connected across contacts 6 and 26 by means of electrodes 28 and 30, respectively. Utilizing this arrangement, the magnitude of the sound wave traveling through the crystal can be observed at the detector when the generator 12 is either off or on, thus making possible the observation of the amplification of the sound wave.

Figure 2A:
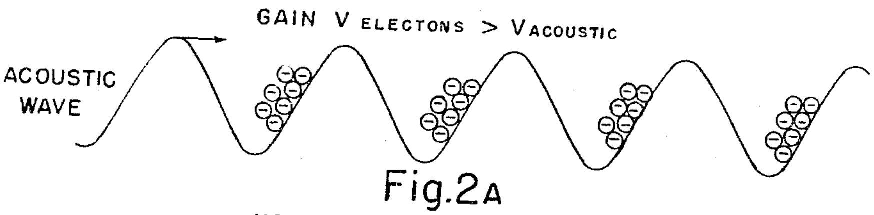
FIGURES 2A–2C are schematic diagrams illustrating the simultaneous reaction of an acoustic wave and drifting electrons traveling through a piezoelectric semiconductor crystal.

Referring now to FIGURE 2, the acoustic wave traveling through the piezoelectric semiconductor sample 2 and the current flow through the sample due to the electrical field created by the generator 12 are shown in schematic form for purposes of illustration only. Referring specifically to FIGURE 2A, the sinusoidal representation illustrates the acoustic wave traveling through the sample from left to right with a given velocity denoted V acoustic. An electron drift from left to right is also created in the sample as a result of the externally applied electric field across the sample. When the electron drift velocity exceeds the velocity of the acoustical wave, such as schematically illustrated in FIGURE 2A by the electrons preceding the acoustic wave, energy will be transferred from the drifting electrons to the acoustic wave causing an amplification of the amplitude of the acoustic wave. In order for the electron drift velocity to exceed the velocity of the acoustic wave, the electrical conductivity of the sample and the magnitude of the electric field causing the drifting electrons must have the proper values. As explained in the above noted White reference, the electrical conductivity of the sample must be relatively high such as is readily provided in a semiconductor material. The gain realized depends upon several factors, such as the electromechanical coupling coefficient between the drifting electrons and the acoustic wave, the magnitude of the wavelength of the acoustic wave as compared to the length of the sample, the applied voltage and other factors.

Figure 2B:
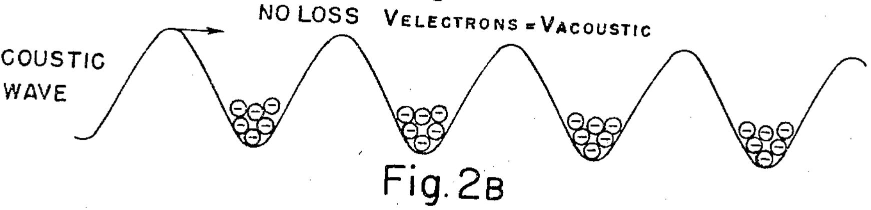
Figure 2C:
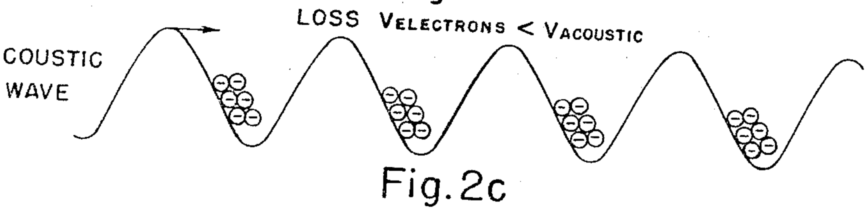

An acoustic wave and an electron drift through the sample with equal velocities is shown schematically in FIGURE 2B, wherein no energy transfer occurs. A schematic representative of an electron drift through the sample having a velocity less than the velocity of the acoustic wave is shown in FIGURE 2C and represents a transfer of energy from the acoustic wave to the drifting electrons, the result being an attenuation of the acoustic wave amplitude. The condition of a gain as depicted in FIGURE 2A can be thought of as the drifting electrons pushing the acoustic wave and thus transferring energy to it. Conversely, attenuation of the acoustic wave as shown in FIGURE 2C can be thought of as the acoustic wave pushing the drifting electrons and thus giving up energy. All of these representations are for an acoustic wave and drifting electrons traveling in the same direction through the crystal. If the acoustic wave travels through the crystal in the opposite direction to the drifting electrons, the acoustic wave will be attenuated. Thus, if the ultrasonic wave is reflected at the ends of the crystal, it will be attenuated when its direction is opposite to the drifting electrons and may be amplified when its direction is the same as the drifting electrons. It can be shown that a net gain can be realized by causing the amplification of the wave traveling with the drift field to exceed both the attenuation of the ultrasonic wave traveling in the opposite direction and the end losses.

The amount of gain per pass depends upon the magnitude of the externally applied voltage causing the drifting electrons, the resistivity of the crystal and the frequency of the ultrasonic wave. With no voltage applied, the acoustic wave will be attenuated. Thus, externally applied voltage is necessary to achieve the no loss condition of FIGURE 2B. In this sense, the schematic illustrations of FIGURE 2B is misleading, since it is in actuality a condition of energy transfer from the drifting electrons to the acoustic wave.

Another important factor controlling the gain is the relative dimensions of the sample and the acoustic wavelength. It can be shown that as the length of the sample is increased in the direction of the acoustic wave propagation as compared to the acoustic wavelength, the gain per pass of the acoustic wave through the sample, or the gain per wavelength, increases. Thus, if the sample length and the wavelength are comparable, only a small gain will result in a single pass of the acoustic wave through the crystal.

All of the above effects, including the current limiting effect to be presently discussed, will be helpful in a more complete understanding of the invention, wherein a similar energy transfer from drifting electrons to an acoustic wave is believed to occur in order that the current limiting effect and the oscillation effect of the invention be observed.

A current limiting effect has also been observed in a piezoelectric semi-conductor crystal such as that shown in FIGURE 1, and a description of the current limiting effect in cadmium-sulfide (CdS) is described in the publication by R. W. Smith, Phys. Rev. Letters, volume 9, page 87 (1962). A circiut for observing the current limiting effect is shown in the electrical schematic diagram of FIGURE 3 and comprises a piezoelectric semiconductor sample 40 having ohmic contacts 42 and 44 attached to the two ends thereof, and electrodes 46 and 48 connected to the two ohmic contacts 42 and 44, respectively. An input resistor 50 is connected between the electrode 48 and ground. An input voltage $e_i$ is applied between terminals 54 and 53 across the input resistor to create a current within the sample 40. The sample 40 is, therefore, connected in series with the output resistor 52 with this combination connected in parallel with the input resistor 50. Thus, the same current flows in the sample and the output resistor 52. The output voltage $e_o$ is detected across output terminals 56 and 57 connected across output resistor 52. As the input voltage $e_i$ is increased from zero, the output voltage $e_o$ will also increase in an approximately linear fashion therewith. This is shown in the graphical representation of FIGURE 4, which shows the current in amperes through the sample 40 and output resistor 52 as a function of the electric field in volts/mil created within the sample. For purposes of illustration only, the graphical representation of FIGURE 4 relates to a CdS sample having a resistivity of about 1.0 ohm-centimeter, with the electric field being parallel with the C-axis of the crystal. In this particular case, the current through the sample is an aproximately linear function of the electric field up to about 5 volts, and above this field, the current in the sample no longer increases very little, if any, resulting in a current limiting effect.

The current limiting effect just described is explained in terms of phenomena similar to that described with reference to the acoustic amplifier. It is believed that the current limiting effect occurs only when the electron drift velocity through the sample, which is created by the externally applied voltage thereacross, exceeds the velocity of the piezoelectrically coupled acoustic wave traveling through the sample. As described in conjunction with FIGURE 1, external means is used to generate an acoustic wave within the sample 2. However, acoustic energy is continuously being coupled into the crystal 40 of FIGURE 3 from without or being generated internally as a result of thermal vibrations or other causes regardless of the application to the crystal of a voltage or external acoustic source such as shown in FIGURE 1. This acoustic energy, which is inherent in the crystal, is believed to have a wide band of freqeuncies which travel more or less at random within the crystal. This should not be confused with the acoustic wave generated within the crystal when the electric field is first established therein and which has a frequency governed by the natural frequency or mode of the piezoelectric sample. The natural frequency wave caused by the electric field decays out in most cases. However, the fact that the sample exhibits piezoelectricity enables the so-called random acoustic phenomena to be established with some magnitude. When the electric field established within the crystal exceeds a certain predetermined minimum value, the drifting electron velocity exceeds or tends to exceed the velocities of the acoustic waves traveling within the sample. At some electric field value above that, the current limiting effect is observed, and it is believed that at least most of the energy supplied by the increasing electric field which would tend to increase the current flow through the sample is transferred to the acoustic wave whose frequency has the maximum gain through the same mechanism as described with reference to the acoustic amplification effect. The relationships between the electric field magnitude, electrical resistivity of the material, length of the sample, frequency and gain of an acoustic wave will be set forth in some detail hereinafter. From the above observations, it has been deduced that the current limiting effect is the result of clamping the velocity of the drifting electrons caused by the externally applied electric field at the velocity of the ultrasonic wave or waves absorbing energy therefrom. Thus, an energy transfer the same or similar to that occurring in the amplification effect is believed to exist.

The present invention involves the generation of high frequency oscillations at a single fundamental frequency, which oscillations may include harmonics of said fundamental frequency. This is observed in a piezoelectric semiconductor sample such as that shown in FIGURE 3 when an electric field whose magnitude is a predetermined minimum value is created within the crystal. These oscillations at a fundamental frequency and/or at harmonics thereof are to be contrasted with random noise oscillations sometimes observed, for example, in acoustic amplification experiments and those previously described in conjunction with the current limiting effect. In at least some cases, however, the current limiting effect is observed at a lower electric field magnitude than that required to produce the oscillations of the invention, and in all cases, it is believed that an energy transfer phenomenon exists between drifting electrons and acoustic waves of one or more frequencies. In the case of cadmium-sulfide (CdS), for example, current limiting is observed at a lower electric field than the sustained oscillations of the invention. Whether or not current limiting is concurrent with or precedes the observed oscillations is academic, however, since it is not the effect with which this invention is concerned.

Figure 3:
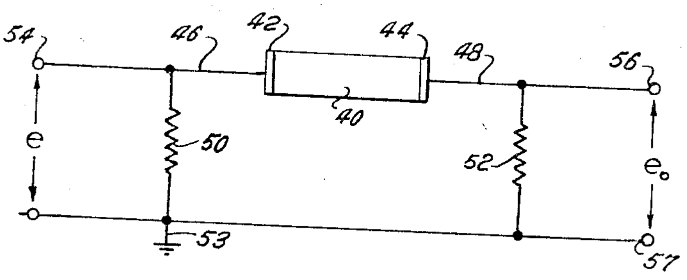
FIGURE 3 is an electrical schematic diagram of a piezoelectric semiconductor crystal connected into an input and output impedance.
Figure 4:
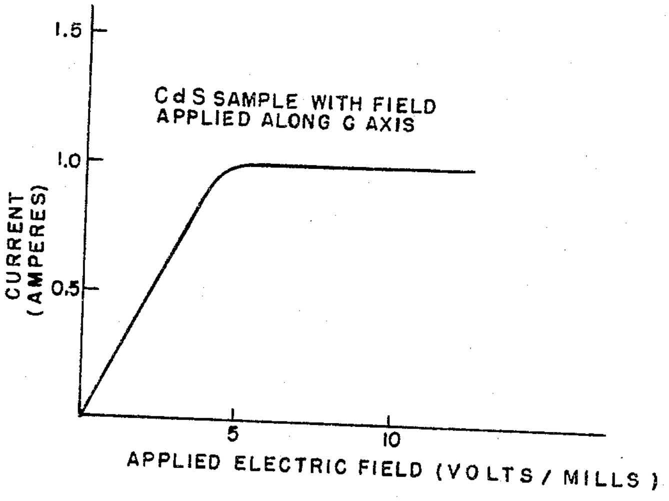
FIGURE 4 is a graphical illustration of a current limiting effect observed in a piezoelectric semiconductor crystal when a current of predetermined minimum value is passed through the crystal.
Figure 5:
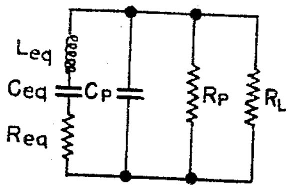
FIGURES 5–7 are electrical schematic diagrams showing three different ways to illustrate the equivalent circuit of the circuit of FIGURE 3, all of which are equivalent.
Figure 6:
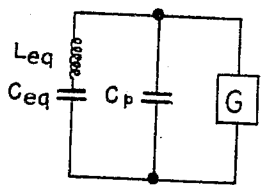
Figure 7:
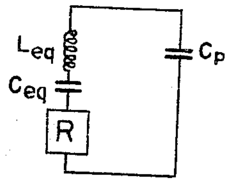

The generation of the high freqeuncy oscillations cannot be sustained unless the sample is electrically coupled to a load impedance having the proper magnitude at the frequency of the oscillations. Measurements of the high frequency oscillations have been made to determine the effect of a resistive load on the oscillating circuit. It has been observed that when the magnitude of the output resistance, such as resistor 52 in FIGURE 3, is below a certain value, the envelope of the oscillations, if any, observed across this load is in the form of a decaying transient. On the other hand, increasing the magnitude of the output resistor, which is equivalent to decreasing the output load, above a certain value causes the envelope of the oscillations to be constant or take the form of an increasing transient. All of these observations indicate that the piezoelectric semiconductor sample acts as an effective negative resistance to form an oscilliatory circuit with the proper output load to sustain oscillations. Measurements taken on CdS as the semiconductor piezoelectric sample using the circuit shown in FIGURE 3 shows that the magnitude of a load resistor to sustain oscillations at room temperature must be greatly in excess of that used at a lower temperature, such as liquid nitrogen temperature, for example. This is believed to be the result of a change in the magnitude of the effective negative resistance of the sample as a function of temperature, where the effective negative resistance decreases as the temperature decreases. Experiments conducted at liquid nitrogen temperature using a CdS sample connected in a circuit as shown in FIGURE 3 prove that oscillations can be sustained across an output load 52 having as little resistance as 1 ohm and lower, where resistor 50 was also in the order of 1 ohm. However, experiments conducted at room temperature indicate a load resistance of several hundred ohms was necessary to sustain oscillations as will be described below. Thus, in addition to the electric field requirement, the load resistance is important. To analyze the oscillatory circuit, reference is had to FIGURE 5 which is one form of an equivalent circuit that can be used to express the electrical equivalent of the sample and the output load. Here, a series circuit of $L_{eq}$, $C_{eq}$, and $R_{eq}$ represent the electrical equivalent of the mechanical inductance, capacitance and resistance posed to the acoustical vibrations within a piezoelectric crystal. The actual electrical capacitance, $C_p$, of the sample between the contacts on the two faces of the crystal can be shown in parallel with the series resonance circuit, and similarly, the actual electrical series resistance, $R_p$, of the crystal and the external load resistance, $R_L$, are also in parallel with the series resonance circuit. It is believed that the series electrical equivalent resistance, $R_{eq}$, of the sample is that which becomes, in effect, negative when the oscillations are observed. The equivalent circuit of FIGURE 5 can be transformed into a different equivalent circuit, such as shown in FIGURE 6, wherein G represents the equivalent conductance of the three resistances $R_{eq}$, $R_p$ and $R_c$ when considered in parallel with the series resonance circuit. Further, a third equivalent circuit can be used as shown in FIGURE 7, where R represents the equivalent resistance of the three resistances $R_{eq}$, $R_p$ and $R_L$ when considered in series with the resonance circuit. For oscillations to be sustained in the equivalent circuit of FIGURE 6, the conductance G of the circuit must be equal to or less than zero. For oscillations to be sustained in the equivalent circuit of FIGURE 7, the resistance R must be equal to or less than zero. These two statements are equivalent just as all of the equivalent circuits shown are equivalent. Analyzing the piezoelectric semiconductor sample on this basis, the load connected across the sample must have a resistance at least as great as the magnitude of the effective negative resistance of the sample. That is the reason why oscillations are sustained with greater loads at lower temperatures than at higher temperatures.

Because of the relatively large negative resistance magnitude of CdS at room temperature, it is difficult, if not impractical, to create the minimum required electric field within the sample necessary to generate oscillations. This becomes apparent when it is considered that a large resistor must be connected with the sample as the load to sustain oscillations, which resistor is normally much greater than the positive resistance of the sample. Thus, a voltage which must be applied across both the sample and the load will result in most of the voltage appearing across the load so that a virtually prohibitively large voltage source is required in order to apply a sufficient voltage across the sample to initiate the oscillations. And, of course, the load resistor cannot be reduced and still sustain the oscillations.

Figure 8:
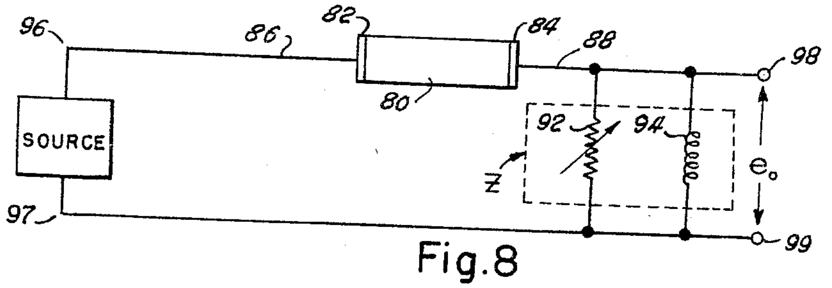
FIGURE 8 is an electrical schematic diagram illustrating one embodiment of the generator of the invention.
Figure 9:
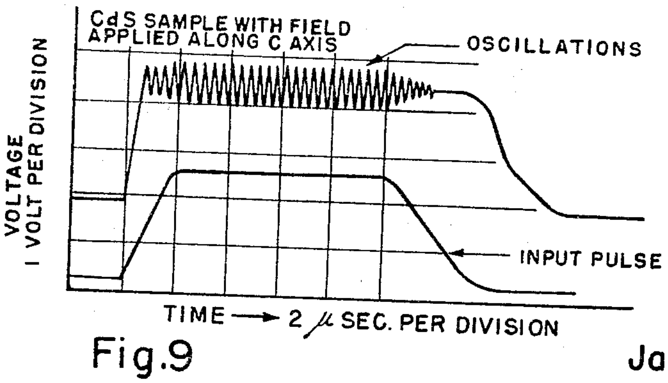
FIGURE 9 is a graphical representation of the high frequency electrical oscillations produced by the generator shown in FIGURE 8.

For a piezoelectric semiconductor crystal, such as CdS, for example, that exhibits a large negative resistance effect at a given temperature, the modified circuit of FIGURE 8 is used to sustain the high frequency oscillations and also to initiate the oscillations without the use of too large a voltage. A semiconductor piezoelectric sample 80 having ohmic contacts 82 and 84 attached to opposite faces thereof is connected to a pair of electrodes 86 and 88, respectively. A choke or inductor 94 is connected in parallel with an output resistor 92, which can be variable, to form an output load Z, and this combination is connected to electrode 88. A source 90 for generating a current through the sample is interconnected with the sample electrode 86 and the load Z, and the oscillations are observed between terminals 98 and 99 taken across the load. The output load can be made to have a very low impedance to low frequency signals or D.C. current flow because of the shunting effect of the inductor 94, so that the minimum required field can be established within the sample with a relatively low source voltage. In the case of CdS, this field will be in excess of that required to produce current limiting. Because of the high frequency of the oscillations, the reactance of choke 94 becomes very large, so that the effective impedance of the output load is the magnitude of resistor 92. If resistor 92 has the proper magnitude as described with reference to the preceding equivalent circuits, the oscillations will be sustained within the oscillatory circuit defined by the sample and load. The proper resistive magnitude can be determined experimentally by using a variable resistor, as shown, and gradually increasing its resistance until the oscillations are just sustained. The graphical representation of FIGURE 9 illustrates the oscillations generated by applying to a CdS sample a voltage pulse having an amplitude in excess of that required for current limiting, where the oscillations are generated during the portion of the pulse that is of sufficient amplitude. A D.C. voltage can also be used to provide the necessary electric field in the sample.

It has been observed that several parameters can affect the frequency of the oscillations. For example, when a CdS sample is operated at liquid nitrogen temperature, the oscillation frequency has a corresponding wavelength which is about twice the length of the sample when the sample is sufficiently loaded by reducing the resistance of the load to a low value. Specifically, a 15 mil length CdS sample having a room temperature resistivity of about 1.0 ohm-centimeter was operated in the circuit of FIGURE 3 with each of resistors 50 and 52 being about 1.0 ohm. At an electrical field within the sample of about 4–7 volts/mil, the sample broke into oscillations at a frequency of about 5.5 megacycles/second extensional waves. The velocity of extensional waves in CdS is about $4.3 \times 10^5$ cm./sec., which yields a wavelength of about 30.7 mils for the above frequency. Thus, the length of the sample corresponds very closely to the half-wavelength of the oscillations. From this, it would appear that the oscillations frequency approaches the natural piezoelectric frequency of the sample as it is loaded sufficiently at this temperature. In other words, the length of the sample is seen to have some effect on the frequency of the oscillations.

As the resistance of the load in the above set-up is increased, however, the frequency is seen to decrease in a reasonably linear relation therewith. And as the length of the sample is decreased, the frequency increases. Further, as a reactive component is added to the load as shown in FIGURE 8, the frequency decreases as the resistance is increased. For the set-up at room temperature using the circuit of FIGURE 8 with the same CdS sample, a resistance 92 of about 500 ohms and a rectance of about 7 microhenries, the frequency of the oscillations was observed to be about one-half that at liquid nitrogen temperature, thus indicating a possible change from a half to a quarter wavelength oscillation mode. In addition, the frequency was noted to increase approximately linearly with increasing applied electric field with a constant load.

The carrier mobility of the sample contends the magnitude of the electric field required to produce the oscillations, where lower electric fields are required for higher mobilities. It is also believed that some minimum amount of gain per pass through the sample of the acoustic waves is required in order to produce the oscillations. It has been observed that the resistivity of the sample, which can be relatively independent of the mobility, determines to some extent the frequency of acoustic waves of maximum gain, whereby the higher the resistivity, the lower the frequency of maximum gain. Although the frequency of the observed oscillations is not necessarily the frequency of maximum gain, it appears as is sufficient gain per pass to promote sustained oscillations can be achieved by insuring the proper resistivity. That is to say, if the resistivity of the sample is very large, the frequency of maximum gain tends to be smaller, and if the crystal length is too small, the oscillations which will tend to be generated will have a wavelength large as compared to this length, and thus not realize sufficient gain per pass through the sample. This is equivalent to saying that a very long crystal length would be required. It can then be seen that the resistivity of the samples has at least an indirect influence on the oscillation generation and the frequency thereof. Therefore, to achieve high frequency oscillation at a low required electric field, the sample desirably has a high mobility and a relatively low resistivity. All of these, although not completely understood in their effect on the frequency of the oscillations, give source insight into the manner in which the frequency can be controlled and predicted to provide oscillations for various applications.

Although the invention has been described with reference to a sample comprised of cadmium-sulfide, any piezoelectric semiconductor material can be used, which includes the II–VI and III–V compounds of the periodic table for example, wherein CdS is a II–VI compound. Other modifications and substitutions that do not depart from the true scope of the invention will become apparent to those skilled in the art, and it is intended that the invention be limited only as defined in the appended claims.

What is claimed is:

1. A piezoelectric semiconductor oscillator, comprising:

(a) a solid junctionless piezoelectric semiconductor body of substantially constant resistivity, said body capable of producing electrical oscillations in response to an electric field of predetermined minimum magnitude created therein and which exhibits an effective negative resistance when said oscillations are produced, (b) a pair of spaced ohmic contacts to said body, (c) electrical supply means having one terminal ohmically connected to one of said pair of spaced ohmic contacts and another terminal ohmically connected to one end of a load means, the other end of said load means ohmically connected to the other of said pair of spaced ohmic contacts, the load means forming an oscillatory circuit with said body for said electrical oscillations, (d) said load means comprising a parallel combination of only a resistor and an inductor providing a resistive component and a reactive component, the magnitude of said reactive component increasing with increasing frequency, the combined resistance magnitude at the frequency of said electrical oscillations being at least large enough to sustain said oscillations within said oscillatory circuit during the existance of said electric field.

2. The oscillator described in claim 1 wherein said semiconductor body is of cadmium-sulfide and said substantially constant resistivity is approximately 1 ohm-centimeter at room temperature.

References Cited

UNITED STATES PATENTS

| | | | |
|---|---|---|---|
| 2,852,677 | 9/1958 | Shockley | 331—115 |
| 2,891,160 | 6/1959 | Leblond | 331—107 X |
| 2,899,652 | 8/1959 | Read | 331—115 X |
| 2,975,377 | 3/1961 | Price et al. | 331—107 X |
| 3,011,133 | 11/1961 | Koenig et al. | 331—107 |
| 3,054,070 | 9/1962 | Rutz | 331—107 |
| 3,160,828 | 12/1964 | Strull. | |

FOREIGN PATENTS 889,576 2/1962 Great Britain.

OTHER REFERENCES

Norken et al.: "Compound Semiconductor Oscillator," IBM Technical Disclosure Bulletin, vol. 4, No. 7, December 1961, pages 79, 80.

Smith: "Current Saturation in Piezoelectric Semiconductors," Physical Review Letters, vol. 9, No. 3, Aug. 1, 1962, pages 87-90.

Miller: "Light Powered Oscillator," IBM Technical Disclosure Bulletin, vol. 3, No. 4, September 1960, page 38.

Larrabee et al.: The Oscillator-New Type of Semiconductor Oscillator, Journal of Applied Physics, vol. 31, No. 9, September, 1960, pages 1519–1523.

ROY LAKE, *Primary Examiner.*

J. B. MULLINS, *Assistant Examiner.*